United States Patent
Hollis (10) Patent No.: US 8,018,358 B2
(45) Date of Patent: *Sep. 13, 2011

(54) BALANCED DATA BUS INVERSION

(75) Inventor: Timothy M. Hollis, Meridian, ID (US)

(73) Assignee: Round Rock Research, LLC, Mt. Kisco, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/715,538

(22) Filed: Mar. 2, 2010

(65) Prior Publication Data

US 2010/0214138 A1    Aug. 26, 2010

Related U.S. Application Data

(63) Continuation of application No. 12/371,697, filed on Feb. 16, 2009, now Pat. No. 7,701,368, which is a continuation of application No. 11/873,779, filed on Oct. 17, 2007, now Pat. No. 7,501,963.

(51) Int. Cl.
*H03M 5/00* (2006.01)
(52) U.S. Cl. .......................... 341/58; 370/295
(58) Field of Classification Search .............. 341/55–90; 370/295–296
See application file for complete search history.

(56) References Cited

U.S. PATENT DOCUMENTS

| | | | |
|---|---|---|---|
| 6,584,526 B1 | 6/2003 | Bogin et al. | |
| 6,943,706 B2 | 9/2005 | Pappalardo et al. | |
| 7,280,412 B2 | 10/2007 | Jang et al. | |
| 7,363,610 B2 | 4/2008 | Alfieri | |
| 7,372,916 B2 | 5/2008 | Pappalardo et al. | |
| 7,408,483 B2 * | 8/2008 | Lee | 341/55 |
| 7,495,587 B2 * | 2/2009 | Bae | 341/55 |
| 7,501,963 B1 * | 3/2009 | Hollis | 341/55 |
| 7,701,368 B2 | 4/2010 | Hollis | |
| 2005/0216630 A1 | 9/2005 | Gaskins et al. | |
| 2005/0289435 A1 | 12/2005 | Mulla et al. | |
| 2007/0242508 A1 | 10/2007 | Bae | |

OTHER PUBLICATIONS

Author Unknown, "Dynamic Bus Inversion," Lost Circuits, Mainboard Reviews, P4 2.0 GHz Platform Production Boards, Sep. 2001, http://www.lostcircuits.com/motherboard/p4x/3.shtml.
International Search Report issued in PCT/US2008/079131 on May 25, 2009.
J Macri, Presentation Titled: "GDDR4: Todays's Ultimate Gaming Memory," Presentation given Aug. 10, 2006.

(Continued)

*Primary Examiner* — Lam T Mai
(74) *Attorney, Agent, or Firm* — Lerner, David, Littenberg, Krumholz & Mentlik, LLP (57) ABSTRACT

A method and apparatus for balancing an output load using data bus inversion is disclosed. In brief, one such technique comprises measuring the "balance" of data bits across a data bus (e.g., the number of zero values compared to the number of one values in a set of parallel data bits). If the data bits are unbalanced by a specified amount, a portion of the bits on the data bus are inverted, and the data bits, including the inverted portion, are transmitted. Also, a data bus inversion bit is set to a particular value and transmitted with the data bits to indicate that data bus inversion was used. If the data signal is not unbalanced (i.e., the bits on the data bus do not comprise an unbalanced number of logic values), then the bits on the data bus are transmitted as they are detected, and the data bus inversion bit is set to another particular value to indicate that data bus inversion was not used.

17 Claims, 6 Drawing Sheets

OTHER PUBLICATIONS

Jeong-Don Ihm, et al., An 80nm 4Gb/s/pin 32b 512Mb GDDR4 Graphics DRAM with Low-Power and Low-Noise Data-Bus Inversion, 2007 IEEE International Solid-State Circuits Conference, Feb. 11-15, 2007.

K.S. Sainarayanan et al., "Minimizing Simultaneous Switching Noise (SSN) using Modified Odd-Even Bus Invert Method," Proceedings of the Third IEEE International Workshop on Electronic Design, Test and Applications (Delta'06), Jan. 2006.

Written Opinion issued in corresponding PCT application serial No. PCT/US2008/079131, issued May 25, 2009.

* cited by examiner

| Data without Data Bus Inversion | | Data with Data Bus Inversion | | |
|---|---|---|---|---|
| 0 1 2 3 4 5 6 7 | Transitions | 0 1 2 3 4 5 6 7 | DBI | Transitions |
| 0 0 0 0 0 0 0 0 | N/A | 0 0 0 0 0 0 0 0 | 1 | N/A |
| 1 1 1 1 1 1 1 1 | 8 | 0 0 0 0 0 0 0 0 | 0 | 1 |
| 0 0 0 0 0 0 0 0 | 8 | 0 0 0 0 0 0 0 0 | 1 | 1 |
| 1 1 1 1 1 1 1 1 | 8 | 0 0 0 0 0 0 0 0 | 0 | 1 |
| 1 0 1 1 0 1 1 0 | 3 | 0 1 0 0 1 0 0 1 | 0 | 3 |
| 0 0 1 1 0 0 1 1 | 3 | 1 1 0 0 1 1 0 0 | 0 | 3 |
| 0 1 0 1 0 0 1 0 | 3 | 1 0 1 0 1 1 0 1 | 0 | 3 |
| 1 1 0 0 0 1 0 1 | 6 | 1 1 0 0 0 1 0 1 | 1 | 4 |
| 0 0 1 0 1 0 1 0 | 7 | 1 1 0 1 0 1 0 1 | 0 | 2 |

| Data without Data Bus Inversion | | | | Data with Data Bus Inversion | | | |
|---|---|---|---|---|---|---|---|
| 0 1 2 3 4 5 6 7 | '0's | '1's | | 0 1 2 3 4 5 6 7 | DBI | '0's | '1's |
| 1 1 1 1 1 1 1 1 | 0 | 8 | → | 0 0 0 0 1 1 1 1 | 1 | 4 | 5 |
| 0 1 1 1 1 1 1 1 | 1 | 7 | → | 1 0 0 0 1 1 1 1 | 1 | 3 | 6 |
| 0 0 1 1 1 1 1 1 | 2 | 6 | → | 1 1 0 0 1 1 1 1 | 1 | 2 | 7 |
| 0 0 0 1 1 1 1 1 | 3 | 5 | | 0 0 0 1 1 1 1 1 | 0 | 4 | 5 |
| 0 0 0 0 1 1 1 1 | 4 | 4 | | 0 0 0 0 1 1 1 1 | 0 | 5 | 4 |
| 0 0 0 0 0 1 1 1 | 5 | 3 | | 0 0 0 0 0 1 1 1 | 0 | 6 | 3 |
| 0 0 0 0 0 0 1 1 | 6 | 2 | → | 1 1 1 1 0 0 1 1 | 1 | 2 | 7 |
| 0 0 0 0 0 0 0 1 | 7 | 1 | → | 1 1 1 1 0 0 0 1 | 1 | 3 | 6 |
| 0 0 0 0 0 0 0 0 | 8 | 0 | → | 1 1 1 1 0 0 0 0 | 1 | 4 | 5 |
| 1 1 0 0 0 0 0 0 | 6 | 2 | → | 0 0 1 1 0 0 0 0 | 1 | 6 | 3 |

BALANCED DATA BUS INVERSION

CROSS REFERENCE TO RELATED APPLICATIONS

This application is a continuation of U.S. patent application Ser. No. 12/371,697, filed Feb. 16, 2009, which was a continuation of U.S. patent application Ser. No. 11/873,779, filed Oct. 17, 2007 (now U.S. Pat. No. 7,501,963). Priority is claimed to both of these applications, and they are both incorporated herein by reference in their entireties.

FIELD OF THE INVENTION

Embodiments of this invention relate to improved methods for balancing a signal load across a data bus interconnecting two systems such as a Memory Controller and a Synchronous Dynamic Random Access Memory (SDRAM).

BACKGROUND

Figure 1:
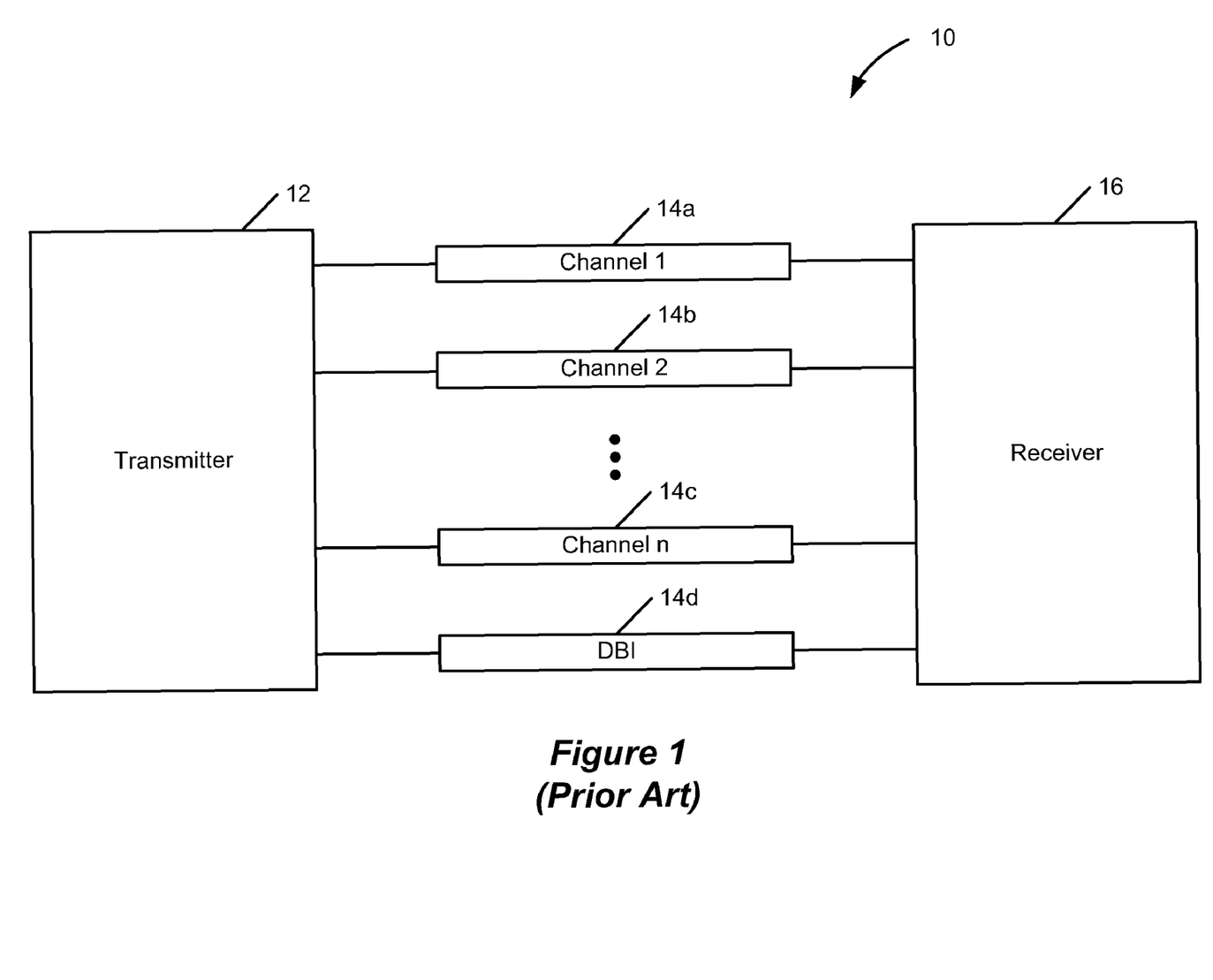
FIG. 1 illustrates a block diagram of a transmission system on a printed circuit board.

Data transmission across high-speed chip-to-chip interconnects may take a number of forms. One example illustrating data transmission between high-speed components within a single semiconductor device, or between two devices on a printed circuit board, is represented by the system 10 shown in FIG. 1. In FIG. 1, a transmitter 12 (e.g., a microprocessor) sends data over one or more transmission channels 14a-14c (e.g., copper traces "on-chip" in a semiconductor device or on a printed circuit board) to a receiver 16 (e.g., another microprocessor or memory). As a group, such transmission channels 14a-14c are often referred to as a "data bus," which allows one or more data signals to be transmitted from one device to another.

Ideally, when a data signal comprising a series of bits (e.g., a bitstream) is sent from a transmitter 12 to a receiver 16 across a channel (e.g., 14a), all of the energy in a transmitted bit is contained within a single time cell, which is often referred to as a unit interval (UI). At the same time, it is hoped that energy from other bits, whether spatially close in time and on the same channel, or spatially close in physical proximity on a neighboring channel (e.g., 14b, 14c), will not affect the bit of interest. Unfortunately, in high-speed applications, this is typically not the case. At least three distinct phenomena result in such interference.

First, pulse dispersion on a given channel, resulting from non-uniform group delay and other bandwidth limitations, results in the spreading of pulse energy beyond the boundaries of the single UI. As a result, energy from bits preceding or following a bit of interest in the bitstream can potentially impact both the amplitude and timing of the bit of interest. This phenomenon is referred to as inter-symbol interference (ISI) and is typically addressed through channel equalization. By either preceding or following the transmission channel with a frequency dependent circuit, whose transfer characteristics are the inverse of the channel characteristics, the original signal behavior may be restored.

The second phenomenon is crosstalk, which is associated with capacitive and inductive coupling between channels on the bus. Crosstalk occurs when transitioning data induces either a voltage (inductive crosstalk) or a current (capacitive crosstalk) on a neighboring line. As is the case with ISI, crosstalk from neighboring channels may alter the amplitude and timing characteristics of a bit of interest on a given channel. Crosstalk is most often addressed with careful channel routing techniques, which may include the placement of additional traces between the channels to provide shielding and to reduce inter-channel coupling.

The third phenomenon that may impact a bit of interest, as it is transmitted across the channel 14, is referred to as simultaneous switching noise (SSN). SSN results from the finite capacity of the power supply network to source and sink current from high-current-draw output drivers. Ideally, the supply network acts as a stable reservoir of current. In real systems, however, the supply network exhibits finite resistance, capacitance, and inductance between the nodes where the drivers connect for power. When a large current is drawn by an output driver during a transition, or during a specific UI, that current generates a voltage across the finite resistance in the associated supply path. This induced voltage may cause voltage level variation in other supply nodes connected to neighboring drivers. Depending upon the sensitivity of the other driving circuits to such supply variation, significant variations in the amplitude and timing of their driven signals may be observed.

It is also possible to observe ringing on the supply due to the inductance and capacitance already mentioned. This ringing may additionally impact the signals being driven, depending upon the sensitivity of the corresponding circuits to that form of supply noise. Thus, in a way similar to crosstalk, SSN, as generated by driving circuits on neighboring channels, may affect a bit of interest on a particular channel.

Because crosstalk occurs as a result of transitions of data on neighboring channels, one way to reduce crosstalk is to reduce the frequency of data transitions. The operation of modifying the data content to reduce transitions, or to achieve any other desired behavior, is referred to as data encoding. One specific form of data encoding that can be used to reduce crosstalk is Data Bus Inversion (DBI).

In principle, DBI includes circuitry that first looks at the relationship between bits to be transmitted across a data bus and then decides (based on an algorithm) if it would be advantageous to invert some or all of the bits prior to transmission. If the bits are inverted, an additional signal (often on another data line), referred to as a DBI bit, is also set to indicate that the bits are inverted. Typically, as shown in FIG. 1, an extra channel 14d is then needed so that the DBI bit may be transmitted in parallel with the bits to identify to the receiving circuitry which sets of data have been inverted. The receiver then uses the DBI bit to return the incoming data to its original state.

One specific DBI algorithm which is used to reduce crosstalk is referred to as the "minimum transitions" algorithm. While there may be variations of this technique, in general the minimum transitions algorithm begins by computing how many bits across the bus will result in a transition during the upcoming cycle. When more than a certain number of transitions are predicted, the DBI circuitry inverts the entire bus, sets the DBI bit to a specified state (high or low depending on the implementation), and drives the inverted data and the DBI bit in parallel across the transmission channel, where the DBI bit is used to de-invert the inverted data prior to use in the receiving system.

Figure 2A:
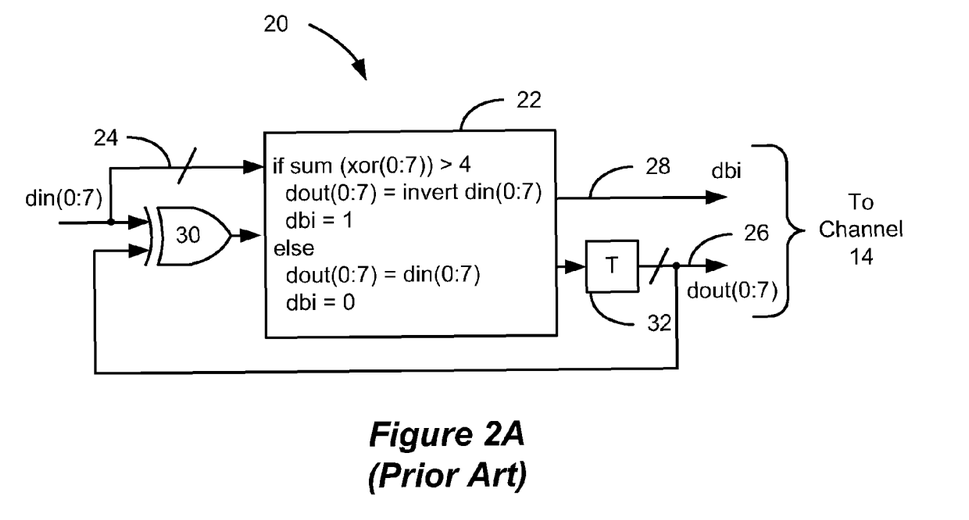
FIG. 2A illustrates block diagram according to the minimum transitions DBI technique.

One implementation of the minimum transitions technique is shown in FIG. 2A. In brief, the minimum transitions technique comprises comparing the state of an incoming data bit with the state of the previous data bit through an exclusive-OR (XOR) operation, in XOR gate 30. In the example shown in FIG. 2A, two successive bytes of data DIN(0:7) are compared to determine which bits in the data signals have changed. After corresponding bits in the two data signals are compared in an XOR operation and the result is summed, a determination is made as to whether the sum is greater than four (i.e., whether there are at least five transitions from the previous byte of data to the current byte). If the sum is greater than four, the current byte is inverted before it is transmitted, and the DBI bit is transmitted as '1.' Alternatively, if the sum of the data lines in the compared byte is four or less (i.e., there are no more than four transitions from one byte to the next), the data is transmitted unaltered, and the DBI bit is transmitted as '0.'

Figure 2B:
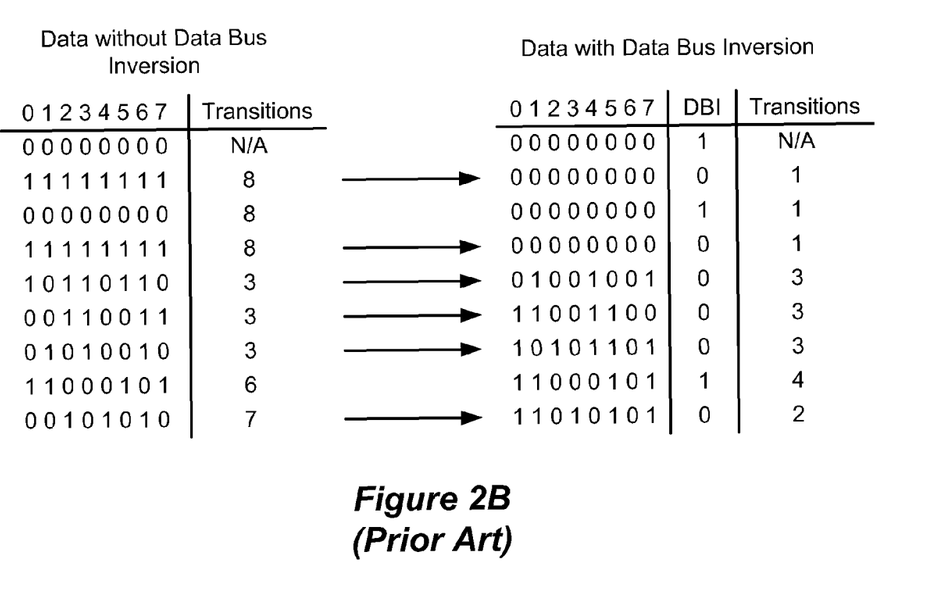
FIG. 2B illustrates a data table according to the minimum transitions DBI technique.

In most cases, as shown in FIG. 2B, the above operations result in no more than three transitions in two successive bytes of data. In any sequence of bytes, no more than four transitions should occur. Example results of the above operations of the computational block 22 are shown in FIG. 2B.

As can be seen in the table titled "Data without Data Bus Inversion," the number of transitions between two successive non-modified data signals may be derived directly from two successive groups of bits 0-7. For example, from the first data byte '00000000' to the second data byte, '11111111' eight transitions occur and are sent on a channel 14.

Simulated results from using the minimum transitions data bus inversion technique may be seen in the table titled "Data with Data Bus Inversion." This table shows the result of using the minimum transitions algorithm on the 'next' byte of data, in comparison to the current byte of data. When the number of transitions across a non-modified data byte increases to five or more of the data bits (this can be observed by comparing each row of parallel data bits to the left-hand table titled "Data without Data Bus Inversion"), the data byte is inverted and a DBI bit is output as '0.' For example, the second row of data in the table titled "Data without Data Bus Inversion" ('11111111') would result in eight bits transitioning from '0' to '1' if the minimum transitions algorithm weren't used after the first row of data bits ('00000000') is output. Accordingly, to reduce the number of transitions, the minimum transitions algorithm is used, and the parallel data bits are instead output as '00000000' with the addition of a DBI bit ('0'). Use of the DBI algorithm results in only a single transition between the first and second rows of data bits, from the change in the DBI bit. As a result of using this technique, any data byte that would have five or more transitions is inverted, which results in no more than four transitions in the modified data byte. Thus, while nine bits are now sent on a channel 14 instead of eight (including the DBI bit), no more than four transitions will occur from one data byte to the next, which helps to reduce SSN.

The minimum transitions technique reduces the number of transitions, and therefore in many input/output circuits topologies reduces the change in current draw at the transmitter 12, which in turn leads to reducing SSN. Additionally, by reducing the number of transitions in transmitted data, capacitive and inductive crosstalk is reduced between parallel signal paths.

The inventor considers the minimum transitions algorithm to have drawbacks. For example, implementation of the minimum transitions algorithm requires that past bit values be known (i.e., stored for at least one cycle) in order to determine if future transitions will occur. There are configurations in which storing past bit values is not possible. Further, in certain systems, use of the minimum transitions algorithm may increase power dissipation. This is particularly true in systems in which signals are referenced through pull-up resistors to a positive power supply. The minimum transitions algorithm may force a signal to remain in state of maximum power dissipation in an effort to minimize the number of transitions.

Another well-known DBI algorithm is referred to as the "minimum zeros" algorithm, which attempts to address issues related to power dissipation. The purpose of this algorithm is to minimize the number of binary zeros transmitted across a data bus. This is helpful in systems wherein the input/output (IO) circuits use pull-up resistors connected to the positive voltage supply as a means for generating an output signal. In such a configuration, maximum current is drawn from the supply (and hence maximum power is dissipated) when a logic '0' is being driven.

Figure 3A:
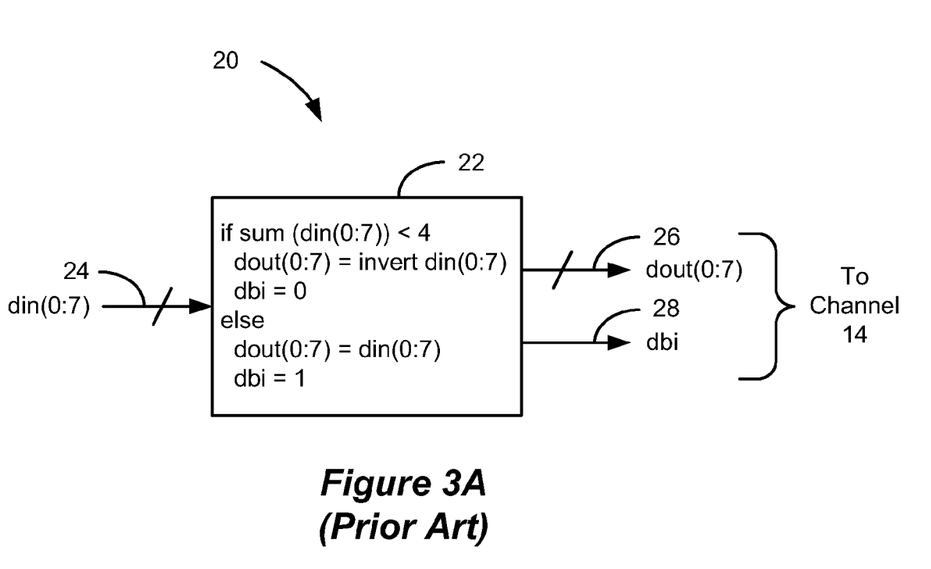
FIG. 3A illustrates block diagram according to the minimum zeros DBI technique.

The minimum zeros technique is implemented as shown in the system 20 in FIG. 3A, which may be present, for example, in the transmitter 12 shown in FIG. 1. As shown in FIG. 3A, an input data bus 24 inputs a plurality of input data bits DIN(0:7) to computational block 22. The computational block 22 performs operations on the input data bits and outputs the results as output data bits DOUT(0:7) on an output data bus 26 and as a data bus inversion (DBI) bit on DBI line 28, respectively. The output data bus 26 and the DBI line 28 may then lead, for example, to one or more channels 14 in the system 10, shown in FIG. 1.

In brief, the computational block 22 reads a parallel byte of input data and determines whether to invert the input data bus 24. In this example, if half or fewer of the bits of the data byte (i.e., four or fewer bits) comprise 'high' (logic '1') values, then all the bits of the data byte are inverted, and the DBI bit is output as '0.' This will guarantee that no more than four transmitted bits, including the DBI bit, are logic '0.' On the other hand, if at least four of the data bits comprise logic '1' values, the output data bits DOUT are assigned the same logic values as the input data bits DIN (i.e., no bits are changed), and the DBI bit on DBI line 28 receives a logic '1' value. Outputting the DBI bit as a logic '1' value assures that no additional power is consumed in transmitting the DBI bit across the channel 14.

Figure 3B:
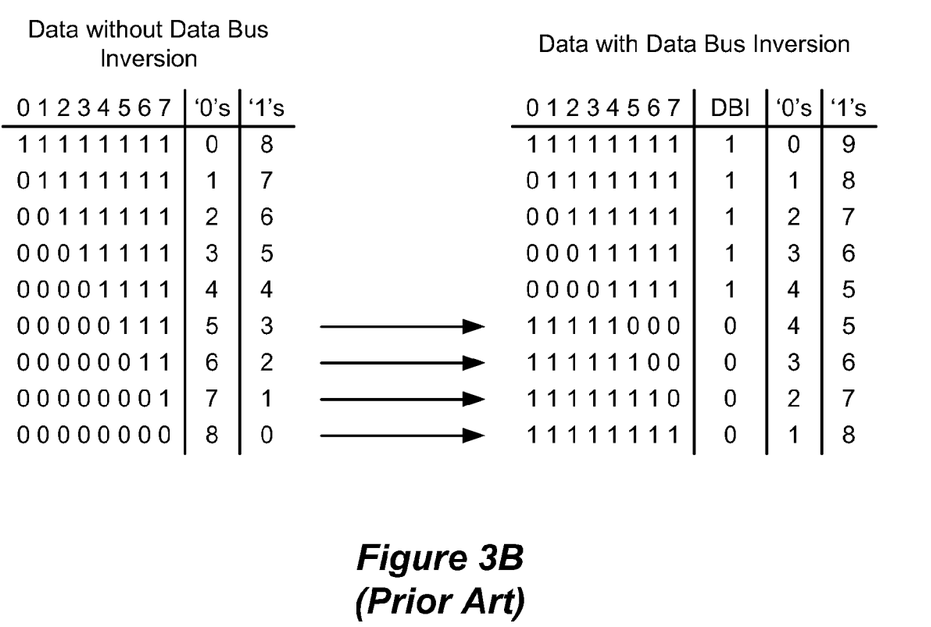
FIG. 3B illustrates a data table according to the minimum zeros DBI technique.

Example results of the above-described operations of the computational block 22 are shown in FIG. 3B. The two tables show example bit sequences, as well as the number of '1' and '0' values that result from normal transmission and from the use of the minimum zeros technique. As can be seen in the table titled "Data without Data Bus Inversion," the number of '1' values or '0' values may be derived directly from the bits 0-7 in a non-modified data byte. For example, from the data byte '00000011,' six '0' values and two '1' values are present on a non-modified data byte that would then be sent on a channel 14. On the other hand, as seen in the table titled "Data with Data Bus Inversion," when the number of '0' values increases to five or more of the bits in the data byte, the data byte is inverted and a DBI bit is output as '0.' Thus, while nine bits are now sent on the channel 14 instead of eight, no more than four of the nine transmitted bits have logic '0' values, which reduces the number of transmitted '0' bits from five (as seen in the table on the left) to four (as seen in the table on the right).

Although the computational block 22 is shown implemented as pseudocode in FIG. 3A, one skilled in the art will appreciate that the computational block 22 may be implemented in software or in hardware. For example, computational block 22 may be implemented using hardware components such as an application specific integrated circuit (ASIC), a field-programmable gate array (FPGA), or combinations of hardware logic elements designed to perform the functionality discussed above.

The use of a DBI algorithm such as either the minimum zeros or the minimum transitions typically requires that an additional bit (i.e., the DBI bit) is included on a data bus or in a transmitted data signal. However, the improvements that result from reducing consumed power, correct signal detection, etc., typically outweigh the negative effects of the resulting decrease in physical space in the integrated circuit or the decrease in bandwidth of the channels 14.

Each of the aforementioned data bus inversion techniques capitalizes on certain characteristics of data signals and the transmission channels on which the data signals are sent. However, in the inventor's opinion, an improved data bus inversion technique would attempt to improve upon these characteristics. The disclosed techniques achieve such results in a manner implemented in a typical computerized system or other circuit package.

DETAILED DESCRIPTION

In one embodiment, a method and apparatus for balancing an output load using data bus inversion is disclosed. In brief, one such technique comprises measuring the "balance" of data bits across a data bus (e.g., the number of zero values compared to the number of one values in a set of parallel data bits). If the data bits are unbalanced by a specified amount, a portion of the bits on the data bus are inverted, and the data bits, including the inverted portion, are transmitted. Also, a data bus inversion bit is set to a particular value and transmitted with the data bits to indicate that data bus inversion was used. If the data signal is not unbalanced (i.e., the bits on the data bus do not comprise an unbalanced number of logic values), then the bits on the data bus are transmitted as they are detected, and the data bus inversion bit is set to another value to indicate that data bus inversion was not used.

The balanced DBI technique may be compared to the use of fully differential signaling in high-speed applications. Because fully differential input-output (IO) circuits operate based on steering current, the net current draw during an output driver transition is zero. While balancing the bus, in accordance with one or more embodiments of the invention, does not limit the net current draw during transitions, it does limit the change in the current draw from one cycle to the next. In other words, ideally, the same number of drivers will transition at each cycle boundary. Thus, the balanced DBI technique may be regarded as attempting to reduce the net change or cycle-to-cycle variation in supply current draw to zero.

Figure 4A:
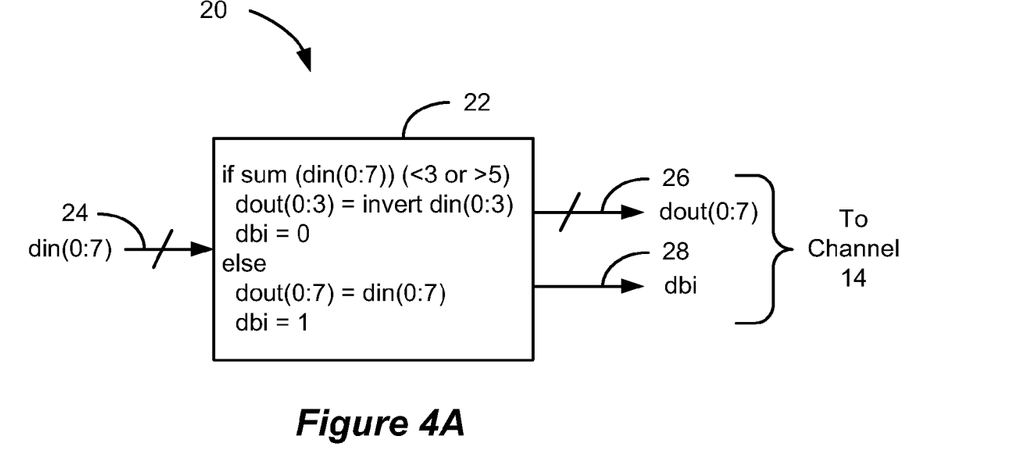
FIG. 4A illustrates a block diagram in accordance with an embodiment of the invention.

The balanced DBI technique may be implemented as shown in the system 20 in FIG. 4A, which may be present, for example, in the transmitter 12 shown in FIG. 1. As shown in FIG. 4A, an input data bus 24 inputs a plurality of input data bits DIN(0:7) to the computational block 22. The input data bus 24 may be viewed as, for example, a byte-wide data bus comprising eight parallel sequences of input data bits. The computational block 22 performs operations on the input data bits and outputs the resulting output data bits DOUT(0:7) on the output data bus 26 and a DBI bit on the DBI line 28, respectively. The output data bits DOUT(0:7) and the DBI bit may then be transmitted to another component in the transmitter 12, or to a channel (e.g., channel 14a).

In brief, the computational block 22 reads a group of parallel bits (in this case, a byte) from several input data signals and determines how many of the bits have particular logic values on the input data bus 24. In this example, assuming a one-byte (eight bit) wide input data bus, if fewer than three or more than five of the bits on the data bus comprise 'high' (i.e., logic '1') values, implying that the transmitted load on the channel 14 will be 'unbalanced,' then the first half of the bits on the data bus (i.e., bits 0 to 3) are inverted, and the DBI bit is output as a '1' value (i.e., the DBI bit is enabled). In broad terms, and as illustrated by this example, if each possible data bit value (i.e., logic '1' and logic '0') is not represented by more than 25% and less than 75% of the total number of data bits evaluated, then the totality of the data bits on the input data bus 24 is considered to be unbalanced, and the balanced data bus inversion technique is used.

On the other hand, if between three and five of the bits on the data bus 24 comprise logic '1' values, implying that the transmitted load on the channel 14 will be 'balanced,' the output data bits DOUT are assigned the same logic values as the input data bits DIN (i.e., no bits are changed), and the DBI bit on DBI line 28 receives a logic '0' value (i.e., the DBI bit is not enabled). In other words, if each possible data bit value (i.e., logic '1' and logic '0') comprises more than 25% and less than 75% of the total number of data bits evaluated, then the totality of the data bits on the input data bus 24 is considered to be balanced, and the balanced data bus inversion technique is not used. In most cases, nearly equal numbers of transmitted bits will be logic '1' as logic '0' (i.e., the data bus will be 'balanced'), as is shown in the tables of FIG. 4B.

Figure 4B:
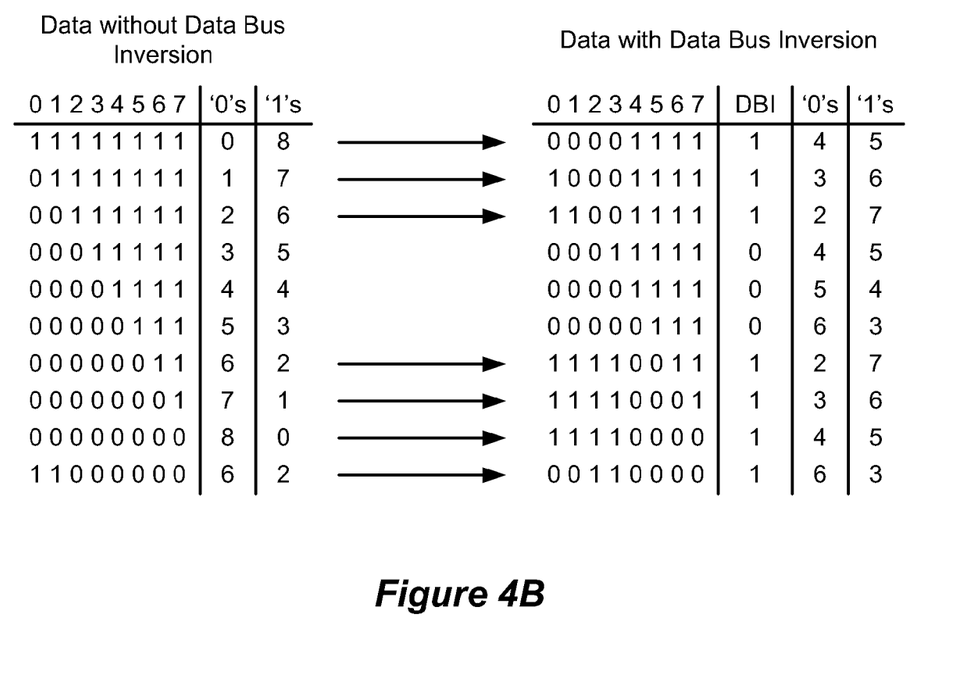
FIG. 4B illustrates a data table in accordance with an embodiment of the invention.

For example, the first byte of data shown in the table titled "Data without Data Bus Inversion" in FIG. 4B would be determined to be unbalanced according to the balanced DBI technique, as there are zero logic '0' values and eight logic '1' values. Accordingly, the first half of the byte is inverted as discussed with reference to FIG. 4A. The result of this data inversion is shown in the table titled "Data with Data Bus Inversion" in FIG. 4B. Specifically, the first four bits of the data byte are inverted to logic '0' values, and the DBI bit is assigned a logic '1' value. This results in a total of four logic '0' bits and five logic '1' bits being transmitted by transmitter 12 across channel 14. Thus, as a result of using this balanced DBI technique, on average no more than five of the eight bits in an eight bit data bus will comprise '0' (or '1') values. As seen, for example, on row 7 of FIG. 4B, there are bit combinations in which the balance of the bus is not improved by the balanced DBI algorithm, but the probability of such an occurrence is small.

The above algorithm may also be summarized in more general, mathematical terms. In general, N original digital data bits are received in parallel from a data bus at the transmitter 12. The original digital data bits may comprise, for example, a logic 0 state or a logic 1 state, although other logic states for the bits are also possible. Based on the received N original data bits, a determination is made as to whether the number of received logic 0 or logic 1 states of the original data bits exceeds a value M. M represents a portion of the N original digital data bits and may be, for example, greater than half of N. M may also be other another value, such as threefourths of N. In other words, a determination is made as to whether at least M of the N original digital data bits are a particular logic state.

If the number of received logic 0 or logic 1 states exceeds M, R of the N original data bits are inverted to create N encoded data bits. Additionally, at least one data bus inversion bit is set to a first state (i.e., enabled), and the N encoded data bits are transmitted in parallel onto the channel with the at least one data bus inversion bit. Alternatively, if the number of received logic 0 or logic 1 states does not exceed M, the at least one data bus inversion bit is set to a second state, and the N original data bits are transmitted in parallel onto the channel with the at least one data bus inversion bit.

Although shown as pseudocode implemented in computational block 22, one skilled in the art will appreciate that computational block 22 may be implemented in software (e.g., on a computer system) or in hardware. For example, computational block 22 may be implemented in hardware devices such as application specific integrated circuits (ASICs), field-programmable gate arrays (FPGAs), or combinations of hardware logic elements designed to perform the functionality discussed above. Such a system may comprise, for example, a processor to execute instructions, memory, and a computer readable medium containing instructions for performing the technique.

Figure 5A:
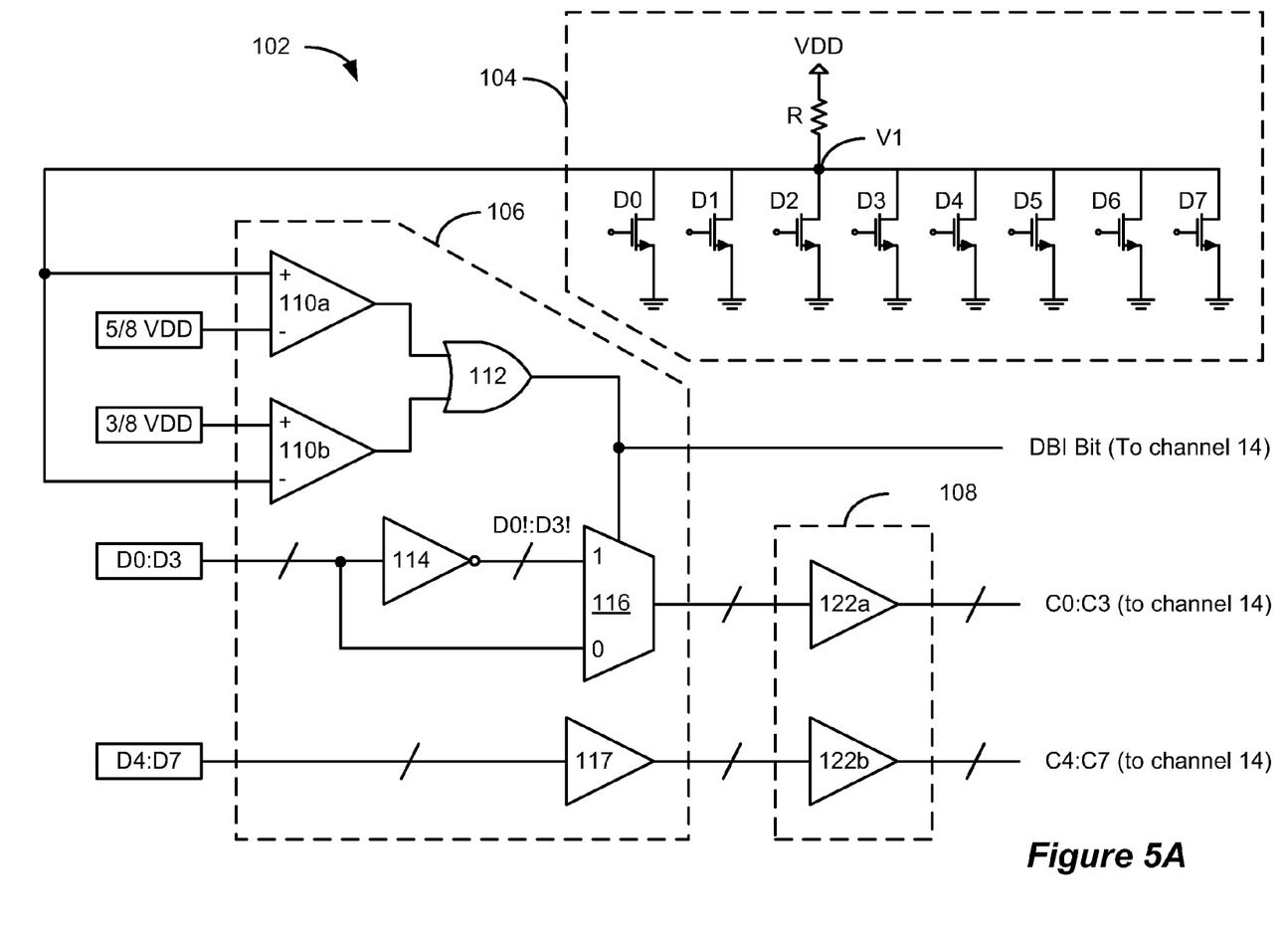
FIG. 5A illustrates a balanced DBI circuit in accordance with an embodiment of the invention.

One example of a hardware circuit is shown in FIG. 5A. Specifically, FIG. 5A shows a balanced output DBI circuit 102 that performs the functionality of computational block 22 shown in FIG. 4A. The balanced output DBI circuit 102 comprises an input block 104, a DBI analysis block 106, and a DBI output path 108. The input block 104 comprises a plurality of data lines D0-D7, each of which are activated by, for example, a transistor, as shown in FIG. 5A. These data lines serve as an input bus to the comparison devices 110*a*, 110*b* in the DBI analysis block 106. The DBI analysis block 106 comprises the comparison devices 110*a*, 110*b*, an OR-gate 112, the inverter 114*a*, and multiplexers (muxes) 116*a*, 116*b*. Comparison devices 110*a* and 110*b*, either of which may be any device capable of performing comparison of two signals (e.g., a comparator, a sense amplifier, a differential amplifier, etc.), receive as input a summed voltage V1, which is proportional to the number of asserted data lines D0-D7, and is realized as a corresponding fraction of the total available supply voltage (e.g. VDD).

The first comparison device 110*a* compares the sum voltage of the data lines D0-D7 (i.e., the voltage at node V1) with ⅝ of the power supply voltage VDD. If V1 is greater than ⅝ VDD, a logic '1' value is output to the OR-gate 112. Similarly, the second comparison device 110*b* compares the sum voltage of the data lines D0-D7 (i.e., the voltage represented at node V1) with ⅜ of the power supply voltage VDD, and if V1 is less than ⅜ VDD, a logic '1' value is output to the OR-gate 112. Thus, if at least 6 or fewer than 3 of the data lines D0-D7 are asserted as logic '1' values (and the resultant voltage at the node V1 is less than ⅜ VDD or greater than ⅝ VDD), which implies that the load on the data lines D0:D7 is unbalanced, then the OR-gate 112 outputs a logic '1' value.

The output of the OR-gate 112 is input to the muxes 116*a*, 116*b* to determine whether normal input or inverted input is selected from each of the muxes. When the output of the OR-gate 112 is a logic '1' (implying that the load on the data lines D0:D7 is unbalanced), the first mux 116*a* selects the inverted data bits D0!-D3!, which have been inverted by the inverter 114. Alternatively, when the output of the OR-gate 112 is a logic '0,' the first mux 116*a* selects the data bits D0-D3, which have not been altered since being output from the input block 104. The second mux 116*b* is included only to match the propagation delay through mux 116*a* and selects the data bits D4-D7 regardless of the signal that is input on the select line of the second mux 116*b*.

The DBI output path 108 comprises buffers 122*a*, 122*b*, and outputs buffered data to the channel 14. While not strictly necessary in this circuit implementation, the buffers 122 stabilize the data and provide current gain before transmission on the channel 14.

Figure 5B:
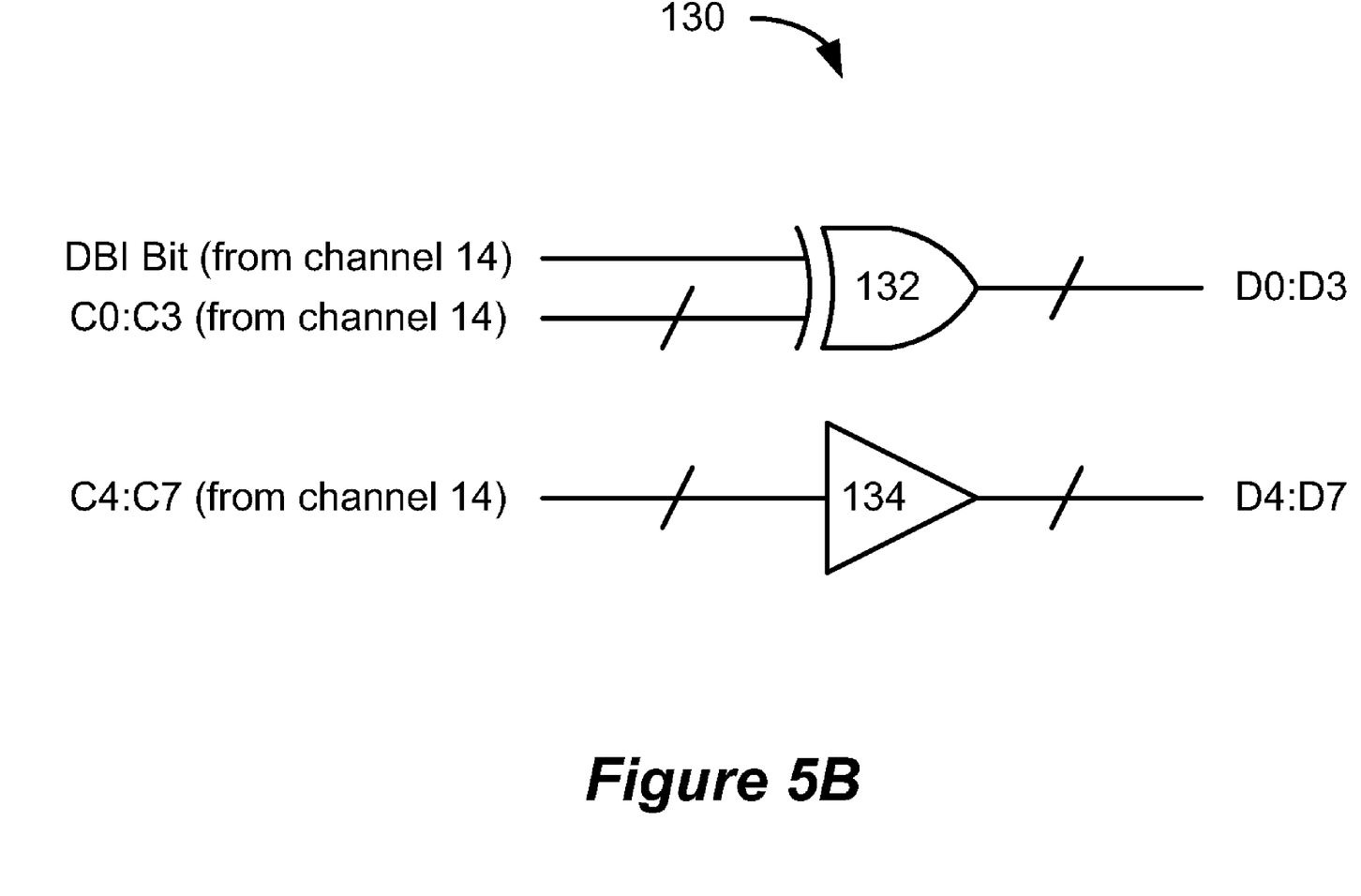
FIG. 5B illustrates a balanced DBI decoder in accordance with an embodiment of the invention.

Detection of signals that may have been modified by the balanced DBI technique may be accomplished in a number of manners. One example illustrating such detection is shown in the system 130 shown in FIG. 5B, which may be present, for example, in a receiver 16 shown in FIG. 1. In FIG. 5B, an XOR gate 132 receives a data bit (e.g., one of the parallel bits encoded by the system shown in FIG. 5A) and the DBI bit, each of which are transmitted on one or more channels 14 (e.g., 14*a*, 14*b*, 14*c*). Through an XOR operation comparing the received DBI bit and the data bit, the XOR gate 132 outputs unencoded data, e.g., to the receiver 16. This may be understood by noting that when the DBI bit comprises a logic '0' value (implying that the DBI algorithm was not used, and the system 130 failed to enable the DBI bit), the XOR gate 132 outputs the value of the data signal. Conversely, when the DBI bit comprises a logic '1' value (implying that the DBI algorithm was used and the DBI bit was enabled), the XOR gate 132 outputs the inverse of the value of the data signal. Specific details of the operation of an XOR gate 132 in receiving a data signal with the DBI bit will be understood by one of ordinary skill in the art.

Numerous modifications of the above disclosed circuitry are possible. For example, while FIG. 6 discloses a data bus inversion circuit using an 8-bit data bus, any bus width, including bus widths that are not powers of two, may be similarly used. For example, a larger bus may be designed by combining input blocks 104, DBI analysis blocks 106, and DBI output paths 108.

Additionally, it is not necessary that the inverted bits on the bus be contained to one half of the bus, as has been discussed. Rather, bit inversion could be applied to any combination of bits across the bus (e.g. every other bit is inverted, etc.) and in some instances it could prove advantageous to invert less than or more than half of the parallel bits. Further, if more than one DBI bit is made available, then different combinations of bits can be inverted. For example, if two DBI bits are available, then four combinations of data bits can be sent across the transmission channel (i.e. no bits inverted, set 1 inverted, set 2 inverted, or set 3 inverted, etc.). It should be noted that if it is found advantageous in a particular circuit implementation, based on the system configuration, the DBI bit may be assigned as a logic '0' value when enabled and a logic '1' value when not enabled. This is consistent with the above algorithm and would only require replacing OR-gate 112 with a NOR gate and the addition of a single logical inverter at the output of the receiving circuitry. In other words, enabling the DBI bit or failing to enable the DBI bit does not require the DBI bit to be set to a particular value.

Further, while the comparators 110*a*, 110*b* use ⅜ VDD and ⅝ VDD as threshold voltages, any threshold voltage determined to represent an unbalanced load may be used (e.g., ¼ VDD, ¾ VDD, etc.). The threshold voltage may be dependent on the width of the bus used.

In summary, the balanced DBI technique minimizes the difference between the number of logic '0' values and logic '1' values being simultaneously transmitted across a channel 14, which should lead to a more consistent current draw from cycle to cycle. As a result of a more consistent current draw, irregularities in the transmission (i.e., voltage and timing variations) may be reduced, and the signal integrity may be improved.

Simulated experimental results indicated an improvement in average eye height of 16.07% and a reduction in average eye jitter of 18.89% over sending and receiving unencoded data, which compares favorably to the minimum zeros and minimum transitions techniques, as shown in Table 1:

TABLE 1

Improvements over unencoded data due to various transmission techniques

| Technique | Average Eye Height Improvement (%) | Average Eye Jitter Improvement (%) |
| --- | --- | --- |
| Minimum Zeros | 15.24 | −26.31 |
| Minimum Transitions | 10.80 | −30.85 |
| Balanced DBI | 16.07 | −18.89 |

Thus, as seen above in Table 1, the use of the balanced DBI technique should result in a reduction in jitter sensitivity. Specifically, the average eye height appears to be improved when compared to other data bus inversion methods, and the average eye jitter appears to be improved when compared to not using a data bus inversion method.

The balanced DBI technique should also have the tendency to limit the number of simultaneous transitions in the same direction, which should produce results similar to the minimum transitions algorithm. However, the balanced DBI technique does not require the storage of past data states, as needed in the minimum transitions algorithm. This simplifies the balanced DBI circuit implementation in comparison to other implementations such as a minimum transitions implementation.

While preferred embodiments of the invention have been disclosed, it should be understood that the disclosed circuitry can be achieved in many different ways to the same useful ends as described herein. In short, it should be understood that the inventive concepts disclosed herein are capable of many modifications. To the extent such modifications fall within the scope of the appended claims and their equivalents, they are intended to be covered by this patent.

What is claimed is:

1. A system for outputting data from a transmitter to a receiver via a channel, the system comprising:
   a transmission block configured to:
   receive N original data bits, wherein the original data bits comprise one of a logic 0 state and a logic 1 state, wherein N is a positive integer; and
   determine whether a number of received logic 0 or logic 1 states of the original data bits is equal to or greater than M, wherein M is a positive integer,
   wherein, in the event that the number of received logic 0 or logic 1 states is equal to or greater than M, the transmission block is configured to:
   invert R of the N original data bits to create N encoded data bits, wherein R is a positive integer less than N; and
   transmit the N encoded data bits; and
   wherein, in the event that the number of received logic 0 or logic 1 states is not equal to or not greater than M, the transmission block is configured to transmit the N original data bits.

2. The system of claim 1, wherein in the event that the number of received logic 0 or logic 1 states is equal to or greater than M, the transmission block transmits at least one data inversion indicator with the transmitted N encoded data bits.

3. The system of claim 2, wherein the data inversion indicator comprises a bit.

4. The system of claim 2, further comprising a receiver configured to:
   assess the transmitted at least one data inversion indicator; and
   in the event that the at least one data inversion indicator is asserted, decode the N transmitted encoded data bits to recover the N original data bits.

5. The system of claim 4, wherein the receiver decodes the N transmitted encoded data bits by uninverting the inverted R original data bits.

6. The system of claim 1, wherein in the event that the number of received logic 0 or logic 1 states is not equal to or not greater than M, the transmission block failing to transmit a data inversion indicator with the transmitted N original data bits.

7. The system of claim 1, wherein the inverted R bits comprises half of N.

8. A system for encoding data, comprising a transmission block configured to:
   (a) receive a plurality of original bits;
   (b) determine whether a logic state is predominant in the plurality of original bits, and wherein:
   (c) in the event that a logic state is predominant in the plurality of original bits, the transmission block being configured to:
   encode a portion of the plurality of original bits to form encoded bits, wherein the portion is less than the plurality of original bits; and
   transmit the encoded bits along with any non-encoded portion of the original bits;
   (d) in the event that a logic state is not predominant in the plurality of original bits, the transmission block being configured to:
   transmit the plurality of original bits without any encoding; and
   (e) receive a next plurality of data bits, and repeating acts (b)-(e).

9. The system of claim 8, wherein the transmission block is configured to encode the portion of the plurality of original data bits to form encoded bits by inverting the portion of original data bits.

10. The system of claim 8, wherein the transmission block is configured to determine whether a logic state is predominant in the plurality of original bits by comparing a voltage indicative of the predominance of the logic state to at least one reference voltage.

11. The system of claim 8, wherein the logic state is determined to be predominant in the event that at least three-quarters of the plurality of original parallel bits comprise the logic state.

12. The system of claim 8, wherein the logic state is determined to be predominant in the event that at least more than half of the plurality of original parallel bits comprises the logic state.

13. A system for outputting data, comprising a transmission block configured to:
   (a) receive a plurality of original bits;
   (b) determine a value indicative of a predominance of a logic state in the plurality of original bits;

(c) compare the value to a threshold and, depending on the comparison, either:
  (i) encode a portion of the plurality of original bits to form encoded bits, wherein the portion is less than the plurality of original bits; and
    transmit the portion of encoded bits, any non-encoded portion of the original bits, and an encoding indicator; or
  (ii) transmit the plurality of original bits without any encoding and without any encoding indicator; and
(d) receive a next plurality of data bits and repeating acts (b)-(d).

14. The system of claim 13, wherein the encoded bits, any non-encoded portion of the original bits, and the encoding indicator, are transmitted in parallel.

15. The system of claim 13, wherein the transmission block forms the encoded bits by performing a data bus inversion algorithm.

16. The system of claim 13, wherein the encoding indicator comprises a bit that indicates whether a portion of the plurality of original data bits has been encoded.

17. The system of claim 13, wherein the transmission block transmits the plurality of original bits without any encoding indicator by transmitting an unasserted encoding indicator.

* * * * *